(12) United States Patent
Bayless

(10) Patent No.: US 10,326,044 B2
(45) Date of Patent: Jun. 18, 2019

(54) METHOD AND APPARATUS FOR PROCESSING SEMICONDUCTOR DEVICE STRUCTURES

(71) Applicant: Micron Technology, Inc., Boise, ID (US)

(72) Inventor: Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/680,461

(22) Filed: Aug. 18, 2017

(65) Prior Publication Data

US 2019/0057901 A1 Feb. 21, 2019

(51) Int. Cl.
| | | |
|---|---|---|
| *H01L 21/00* | (2006.01) | |
| *H01L 29/40* | (2006.01) | |
| *H01L 33/00* | (2010.01) | |
| *H01L 21/78* | (2006.01) | |
| *H01L 23/538* | (2006.01) | |

(52) U.S. Cl.
CPC .......... *H01L 33/0079* (2013.01); *H01L 21/78* (2013.01); *H01L 23/5383* (2013.01)

(58) Field of Classification Search
CPC .................................................... H01L 33/079
USPC ..................................... 257/777; 438/33, 68
See application file for complete search history.

(56) References Cited

U.S. PATENT DOCUMENTS

| | | | |
|---|---|---|---|
| 6,596,639 B1 | 7/2003 | Easter et al. | |
| 7,262,488 B2 | 8/2007 | Draney et al. | |
| 7,883,991 B1* | 2/2011 | Wu | H01L 21/6835 438/459 |
| 8,941,215 B2* | 1/2015 | Hu | H01L 24/06 257/621 |
| 8,951,887 B2* | 2/2015 | Letertre | H01L 21/76254 438/458 |
| 8,970,045 B2* | 3/2015 | Sadaka | H01L 21/486 257/774 |
| 9,147,733 B2* | 9/2015 | Holder | H01L 29/2003 |
| 9,401,303 B2* | 7/2016 | Cheng | H01L 21/76251 |
| 9,876,081 B2* | 1/2018 | Meyer | H01L 21/76256 438/77 |
| 9,915,567 B2* | 3/2018 | Kropelnicki | G01J 5/12 |
| 2009/0261062 A1* | 10/2009 | Kim | B32B 7/12 216/24 |
| 2013/0168803 A1* | 7/2013 | Haddad | H01L 21/50 257/507 |

FOREIGN PATENT DOCUMENTS

KR 10-2014-0002146 * 6/2012 ............... G09F 9/00

* cited by examiner

*Primary Examiner* — Calvin Lee
(74) *Attorney, Agent, or Firm* — TraskBritt

(57) ABSTRACT

A method of processing a device wafer comprising applying a sacrificial material to a surface of a carrier wafer, adhering a surface of the device wafer to an opposing surface of the carrier wafer, planarizing an exposed surface of the sacrificial material by removing only a portion of a thickness thereof, and planarizing an opposing surface of the device wafer. A wafer assembly is also disclosed.

17 Claims, 3 Drawing Sheets

METHOD AND APPARATUS FOR PROCESSING SEMICONDUCTOR DEVICE STRUCTURES

FIELD

This disclosure relates generally to methods of fabricating semiconductor devices. More specifically, disclosed embodiments relate to methods and apparatus for processing semiconductor device structures that may enhance the planarization of bulk semiconductor substrates such as wafers, and reduce the cost of such processes.

BACKGROUND

Conventional wafer carrier systems bond a process wafer, which may also be characterized as a device wafer, to a carrier for back side processing including substantial thinning of the process wafer, after which the process wafer and carrier are separated. However, in order to sufficiently planarize, as well as thin, a device wafer as bonded to the carrier, the carrier itself when bonded to the device wafer and during the device wafer thinning process, should exhibit a sufficient planarity so as to act as a reference plane and prevent unacceptable deviations from planarity of the thinned device wafer.

While carriers in the form of both semiconductor and glass materials are known, it is currently preferred to planarize semiconductor (generally silicon) carriers in the form of carrier wafers, after bonding to the device wafer and before the device wafer is thinned. This preference is largely due to the ability to use the same equipment to planarize a semiconductor carrier wafer as may be subsequently used to thin and planarize the device wafer. In contrast, due to the different material characteristics of a glass carrier, different equipment and specifically the tool element used to contact the glass, must be employed to planarize a glass carrier.

A significant drawback, however, in the use of a carrier wafer of either a semiconductor or a glass material is the required thinning of the carrier wafer during planarizing thereof. Such thinning, typically of at least about 20 μm to no more than about 30 μm restricts the re-use of the carrier to a relative small number of times before the structural rigidity of the thinned carrier wafer is insufficient to support the device wafer during processing. At such point, the carrier wafer must be discarded and replaced with another carrier wafer. As a result, the high volume of device wafers processed in a modern, state of the art semiconductor fab results in costs of hundreds of thousands of dollars, if not more, per year for carrier wafers.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
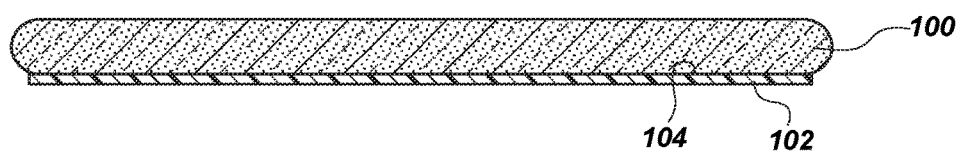
FIG. 1 is a side cross-sectional side view of a first stage in a process of handling a semiconductor device wafer according to embodiments of the disclosure.

The illustrations presented in this disclosure are not meant to be actual views of any particular wafer, wafer assembly, act in a process of handling a semiconductor device structure, system or component thereof, but are merely idealized representations employed to describe illustrative embodiments. Thus, the drawings are not necessarily to scale.

Embodiments of the present disclosure relate generally to a method and apparatus for processing semiconductor device wafers that may enhance the planarity of such wafers after thinning, as well as reduce cost of the thinning process. More specifically, embodiments of the disclosure relate to the use of a sacrificial material applied to a surface of a carrier wafer opposite a surface to be bonded to a device wafer to support the device wafer during an abrasive thinning and planarization process after bonding to the device wafer. A portion of a thickness of the sacrificial material is removed after the device wafer is bonded to the carrier wafer to planarize the temporary, sacrificial material on the carrier wafer. The device wafer is then thinned and planarized, the sacrificial material removed from the carrier wafer, and the device wafer debonded from the carrier wafer.

As used herein, the term "device wafer" means and includes bulk substrates comprising one or more semiconductor materials and which are susceptible to thinning by removal of semiconductor material from the wafer to achieve a lesser thickness. Such substrates may be configured as conventional, circular wafers, other bulk substrates, or segments of such wafers or bulk substrates. Device wafers may comprise an array of semiconductor die sites, which may be singulated into individual dice or larger wafer segments. An active surface of a device wafer may have fabricated thereon, before processing in accordance with embodiments of the disclosure, integrated circuitry, and may have additional dice or stacks of dice placed thereon and, optionally encapsulated. It is contemplated that embodiments of the disclosure are particularly suited for implementation with conventional, circular silicon wafers but the disclosure is not so limited.

As used herein the term "carrier wafer" means and includes substrates of a semiconductor, glass or other suitable material exhibiting sufficient rigidity and a coefficient of thermal expansion (CTE) compatible with a device wafer to be bonded to and support the device wafer for thinning and planarization. It is contemplated, although not required, that a carrier wafer will substantially correspond in size and shape to that of the device wafer.

As used herein, the term "sacrificial material" means and includes a material readily applicable to a surface of the carrier wafer and which will adhere thereto under application of stress to remove a portion thereof by equipment, such as wafer grinding and/or chemical-mechanical planarization tools to be used to thin and planarize a device wafer bonded thereto. Such material also exhibits sufficient hardness and structural integrity so as to maintain integrity, sufficient definition and planarity of surface topography under such applied stress and thereafter. Positive and negative photoresists, spin-on dielectric (SOD) materials, anti-reflective coating (ARC) materials and other materials, such as silicon oxides and silicon nitrides are non-limiting examples of suitable sacrificial materials. Photoresist and SOD materials may be applied by conventional spin coating techniques. ARC materials as well as other oxides and nitrides may be applied by chemical vapor depositions, including low pressure chemical vapor deposition (LPCVD) and plasma enhanced chemical vapor deposition (PECVD). The sacrificial material may be applied to a thickness of, for example, about 15 μm to about 30 μm. As used herein, the term "apply" means and includes physical application of a sacrificial material as well as in situ formation of a sacrificial material.

Referring to FIG. 1, a side cross-sectional elevation of a carrier wafer 100 of a semiconductor or glass material includes a sacrificial material 102, which has been applied to surface 104 thereof.

Figure 2:
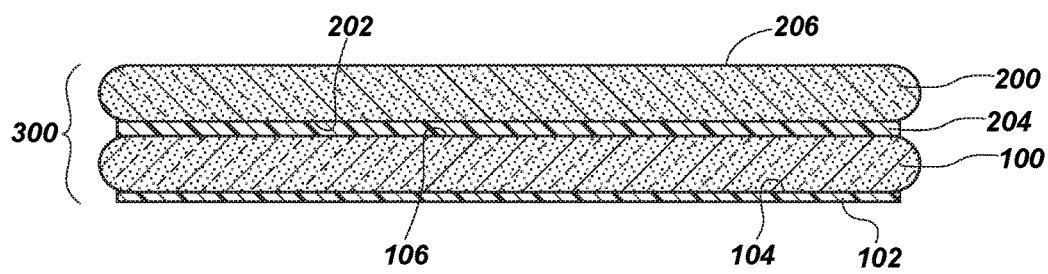
FIG. 2 is a side cross-sectional view of a second stage in the process of handling the semiconductor device wafer.

Referring to FIG. 2, carrier wafer 100 may be inverted, a bonding material 204 applied to surface 106, and a surface 202 (e.g., active surface) of device wafer 200 bonded to surface 106 by bonding material 204 to form an in-process wafer assembly 300, wherein surface 206 of device wafer 200 is to be thinned and planarized. Bonding material 204 may comprise, for example, a polymer material formulated to temporarily adhere to and secure the carrier wafer 100 to the device wafer 200. The material may be substantially void and contamination free, exhibit flatness tolerance and provide warpage control, exhibit stress-absorption characteristics, withstand process temperatures, for example, from about 20° C. to about 320° C., and exhibit chemical resistance to a wide range of liquids and reagents employed in semiconductor fabrication and, in particular, back side processing. Selection of the bonding material 204 may take into consideration wafer materials and types, device types and sensitivity, support carrier types, binding conditions, process conditions, debonding conditions, and residue and cleaning issues.

Bonding materials 204 may include low temperature waxes, hydrocarbon oligomers and polymers, modified acrylates, modified epoxies, modified silicones and high temperature thermoset or thermoset plastics. The bonding material 204 may be applied by, for example, spin coating as a liquid or flowable gel, as a tape, or as a preformed film. More specifically, the bonding material 204 may include a thermoset or a thermoplastic polymer material, preferably formulated to withstand high processing temperatures, such as those employed in material deposition, without permitting relative lateral or vertical movement between the carrier wafer 100 and device wafer 200 secured thereto. As a specific, nonlimiting example, the bonding material 204 may include a cured or partially cured thermoset material or a precursor for forming a thermoset material (e.g., silicone adhesive 401LC, commercially available from Shin-Etsu Silicones of America, Inc., 1150 Damar Drive, Akron, Ohio 44305; adhesive BSI.T14049A; adhesive BSI.D16052K, each commercially available from Brewer Science, 2401 Brewer Drive, Rolla, Mo. 65401; or a precursor material or partially cured variant thereof). A thickness of the bonding material 204 may be, for example, between about 0.5 micron and about 5 microns to provide as thin a bond line as possible while maintaining sufficient adherence of the device wafer 200 to the carrier wafer 100. As a specific, nonlimiting example, the thickness of the bonding material 204 may be, for example, between about 2 microns and about 3 microns (e.g., about 2.5 microns). It is desirable that the thickness of bonding material 204 be substantially uniform across the surface 106 of the carrier wafer 100 to which it is applied before and after device wafer 200 is adhered thereto.

Figure 3:
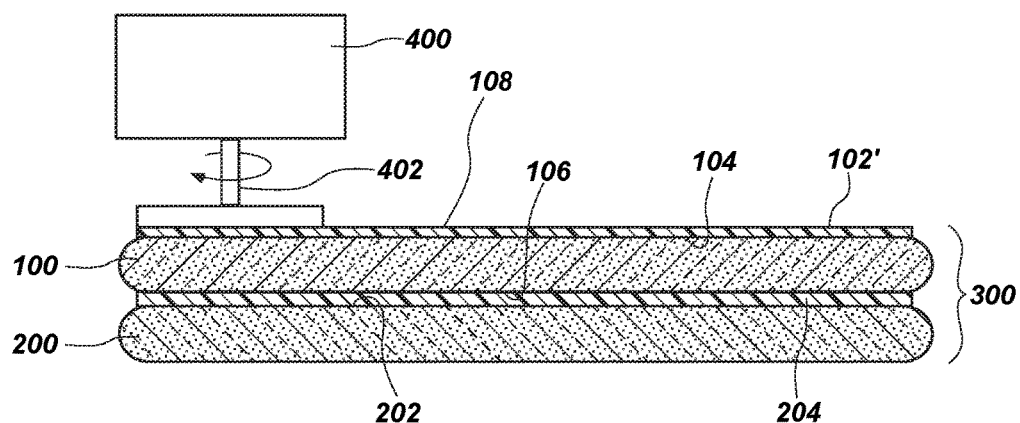
FIG. 3 is a side cross-sectional view of a third stage in the process of handling the semiconductor device wafer.

As shown in FIG. 3, wafer assembly 300 is inverted and the exposed surface 108 of sacrificial material 102 is planarized by removal of only a portion of the thickness of sacrificial material 102 by an abrasive head of back grinding apparatus 402. The removal of only a partial thickness of sacrificial material, for example, about 12 μm to about 15 μm of a total thickness of about 20 μm or, for example, about 22 μm to about 25 μm of a total thickness of about 30 μm, enables a remaining portion 102' of the sacrificial material 102 to compensate for non-planarities in the topography of surface 104. Such compensation provides a sufficiently planar surface to use as a reference plane for subsequent thinning and planarization of device wafer 200 without contacting surface 104 of carrier wafer 100 and removal of material from the wafer. Notably, use of the sacrificial material 102 enables, as with planarization of an uncoated carrier wafer 100, a less expensive, coarse grind process than is employed to thin and planarize device wafer 200. Planarization of sacrificial material 102 may serve as a more precise reference for the subsequent reduction in thickness and planarization of the device wafer benefitting back side and other processing and handling of device wafer 200 that may occur, which may produce more consistent predictable results, increasing yield and reducing variation in thickness across the device wafer. This enables less variation in die thickness, less stress on dice during pick-and-place operations, ensures successful exposure and completion of conductive through vias on the device wafer 200 and generally reduces process variations.

Figure 4:
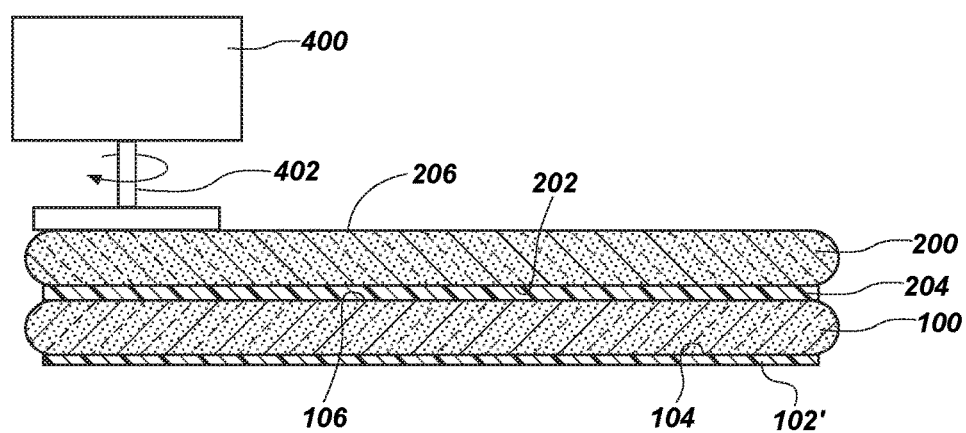
FIG. 4 is a side cross-sectional view of a fourth stage in the process of handling the semiconductor device structure.

As shown in FIG. 4, wafer assembly 300 is again inverted, and exposed major surface (e.g., inactive surface or back side) 206 of device wafer 200 is thinned and planarized using the same equipment as used to planarize sacrificial material 102 on carrier wafer 100. For example, device wafer 200 may be thinned from an initial thickness of about 700 μm to about 800 μm to a final thickness of thinned device wafer 200' of less than 100 μm (see FIG. 5), between (for example) about 50 μm and about 70 μm, although device wafer 200 may be thinned to less than about 50 μm. The total thickness variation (TTV) of the resulting, thinned device wafer 200' is reduced from about 12 μm to about 15 μm to less than about 10 μm, for example, between about 7 μm to about 8 μm or less or, for example, about 3 μm. As referenced herein, the TTV may be characterized as the difference, perpendicular to the planarized surface of the thinned device wafer, between the lowest point and the highest point of the surface topography.

Figure 5:
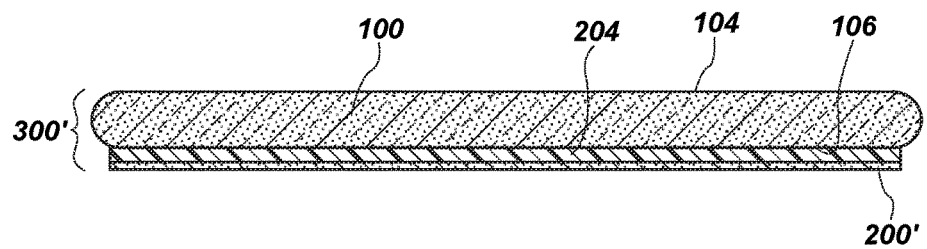
FIG. 5 is a side cross-sectional view of a fifth stage in the process of handling the semiconductor device structure.

As shown in FIG. 5, thinned wafer assembly 300' is inverted, and the remaining portion 102' of sacrificial material 102 may then, optionally, be removed from surface 104 of carrier wafer 100. Whether or not removal of the remaining portion 102' of sacrificial material 102 is desirable before further processing of thinned device wafer 200' may take into consideration the technique to be employed in removing carrier wafer 100 from thinned device wafer 200' after further processing of the latter as described below. If required, suitable removal techniques are dependent upon the material employed for sacrificial material 102, and include without limitation wet (solvent strip) etching and dry (reactive ion) etching.

Figure 6:
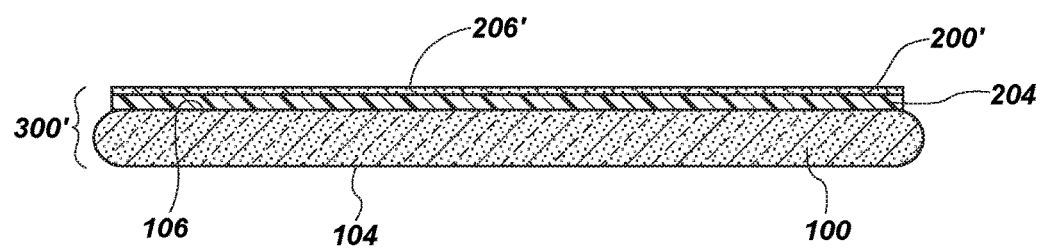
FIG. 6 is a side cross-sectional view of a sixth stage in the process of handling the semiconductor device structure.

As shown in FIG. 6, thinned wafer assembly 300' is inverted once more, so that conventional back side processing of thinned device wafer 200' may be effected on planarized back side 206'. Such back side processing may include, for example, formation of a redistribution layer (RDL) comprising conductive traces connected to through-substrate vias (TSVs) exposed by thinning of device wafer 200, formation of passivation and optional solder mask layers, as well as formation of conductive elements in the form of conductive pillars, columns, bumps or studs, or of solder bumps, extending though openings in the passivation and optional solder mask layers.

Figure 7:
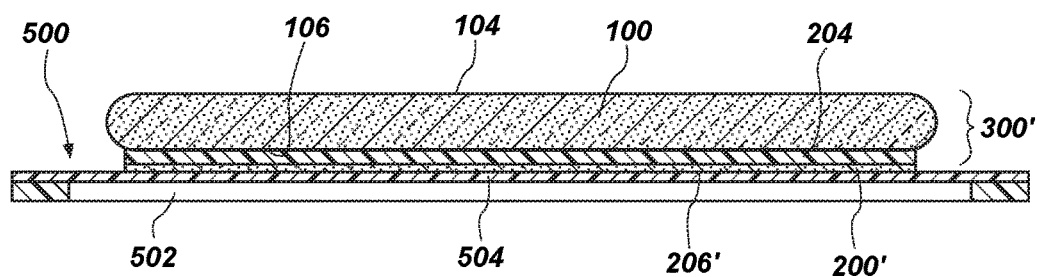
FIG. 7 is a side cross-sectional view of a seventh stage in the process of handling the semiconductor device structure.

As shown in FIG. 7, after back side processing is completed, thinned wafer assembly 300' is once again inverted, and thinned device wafer 200' is secured to a support structure 500 so that the thinned device wafer 200' may be prepared for subsequent removal of the carrier wafer 100. For example, thinned wafer assembly 300' may be temporarily supported on a support structure 500, the support structure 500 located on a side of the thinned device wafer 200' opposite the carrier wafer 100. The support structure 500 may be configured as, for example, a film frame, a lead frame, a tape, or another structure different from the carrier wafer 100 initially secured to the device wafer 200. The thinned device wafer 200' may simply rest on the support structure 400 under the influence of gravity with the support structure 500 located underneath the thinned device wafer 200', or the thinned device wafer 200' may be temporarily secured to the support structure 500 in any suitable orientation. In embodiments where the support structure 500 is configured as a film frame, the support structure 400 may include, for example, an annular, peripheral frame 502 laterally surrounding the thinned wafer assembly 300' and a film 504 secured to the annular, peripheral frame 502, the film 504 located adjacent to, and in some embodiments temporarily adhesively secured to, the planarized back side 206' of the thinned device wafer 200'.

Debonding of the carrier wafer 100 from the thinned device wafer 200' may be effected by a number of conventional, bond material-dependent techniques including, without limitation, mechanical separation, ultraviolet (UV) curing and release, heat curing and release, thermal sliding, chemical activation or solvent swelling, or laser activation. The bond between the carrier wafer 100 and the thinned device wafer 200' may be weakened or eliminated by conventional techniques to facilitate removal of the carrier wafer 100 before the carrier wafer 100 is removed. Some debonding techniques, such as for example UV curing and release or laser activation may, depending upon the sacrificial material 102 employed, require removal of the remaining portion 102' of sacrificial material 102 from surface 104 of carrier wafer to allow energy applied to weaken the bond provided by bonding material 204 between the carrier wafer 100 and the thinned device wafer 200' to effectively penetrate the carrier wafer 100 through surface 104. In other instances, however, the carrier wafer may be removed with the remaining portion 102' of the sacrificial material 102 intact. The carrier wafer 100 may be removed, for example, by sliding laterally or by slowly peeling the carrier wafer 100 off the thinned device wafer 200' secured to the support structure 500 from one edge of the thinned device wafer 200' toward the other (i.e. lifting an edge of the carrier wafer 100). Subsequent to debonding, carrier wafer 100 may be cleaned (including any sacrificial material 102 if present), new sacrificial material 102 applied to a surface thereof, and reused in processing a new device wafer 200. Thinned device wafer 200' may be cleaned of residual bonding material 204 on active surface 202, semiconductor dice singulated therefrom by conventional techniques, and singulated semiconductor dice or other wafer segments including multiple dice may be removed from support structure 400 by, for example, conventional pick-and-place equipment.

An embodiment of the disclosure may be characterized as a method of processing a device wafer, the method comprising applying a sacrificial material to a surface of a carrier wafer, adhering a surface of the device wafer to an opposing surface of the carrier wafer, planarizing an exposed surface of the sacrificial material by removing only a portion of a thickness thereof, and planarizing an opposing surface of the device wafer.

Another embodiment of the disclosure may be characterized as a method of processing a device wafer comprising planarizing an exposed surface of a carrier wafer bonded to a device wafer without removing carrier wafer material and reducing a thickness of the device wafer from an exposed surface thereof and planarizing an exposed surface of the device wafer after the thickness has been reduced.

A further embodiment of the disclosure may be characterized as a wafer assembly comprising a carrier wafer having a substantially uniform coating of a sacrificial material over a surface thereof and a device wafer bonded to an opposing, uncoated surface of the carrier wafer.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. A method of processing a device wafer, comprising:
   planarizing an exposed surface of a carrier wafer bonded to a device wafer without removing material from the carrier wafer; and
   reducing a thickness of the device wafer from an exposed surface thereof and planarizing an exposed surface of the device wafer after the thickness has been reduced.

2. The method of claim 1, further comprising:
   before bonding the device wafer to the carrier wafer, applying a sacrificial material to a surface of the carrier wafer; and further comprising bonding the device wafer to a surface of the carrier wafer uncoated with the sacrificial material.

3. The method of claim 2, wherein applying a sacrificial material to a surface of the carrier wafer comprises applying at least one of a photoresist, a spin-on dielectric (SOD) material, an anti-reflective coating (ARC) material, a silicon oxide material or a silicon nitride material.

4. The method of claim 2, further comprising planarizing the exposed surface of the carrier wafer by grinding away a portion of a thickness of the sacrificial material with a tool; and
   reducing a thickness of the device wafer and planarizing the device wafer by grinding using the same tool.

5. The method of claim 4, further comprising applying the sacrificial material to a thickness of between about 15 μm and about 30 μm, and grinding away a portion of a thickness of the sacrificial material comprises removing about 12 μm to about 15 μm of the thickness.

6. The method of claim 4, further comprising:
    removing any remaining portion of the sacrificial material from the carrier wafer; and
    then removing the carrier wafer from the device wafer.

7. The method of claim 4, further comprising removing the carrier wafer from the planarized device wafer while a portion of the sacrificial material remains on the carrier wafer.

8. A method of processing a device wafer, the method comprising:
    before bonding a surface of a device wafer to a carrier wafer, applying a sacrificial material to a surface of a carrier wafer;
    bonding the surface of the device wafer to an opposing surface of the carrier wafer;
    planarizing an exposed surface of the sacrificial material by removing only a portion of a thickness thereof; and
    planarizing an opposing surface of the device wafer.

9. The method of claim 8, wherein applying a sacrificial material to a surface of a carrier wafer comprises applying at least one of a photoresist, a spin-on dielectric (SOD) material, an anti-reflective coating (ARC) material, a silicon oxide material or a silicon nitride material.

10. The method of claim 8, wherein planarizing an opposing surface of a device wafer comprises planarizing the opposing surface of the device wafer to a total thickness variation (TTV) of between about 3 μm and about 8 μm.

11. The method of claim 8, wherein applying a sacrificial material to a surface of a carrier wafer comprises applying a sacrificial material to a wafer comprising a semiconductor material or a glass material.

12. The method of claim 8, wherein planarizing the opposing surface of the device wafer comprises reducing an initial thickness of the device wafer from at least 700 μm to less than 100 μm.

13. The method of claim 8, wherein applying a sacrificial material to a surface of a carrier wafer comprises applying a sacrificial material to a thickness of between about 15 μm and about 30 μm.

14. The method of claim 13, wherein removing only a portion of a thickness of the sacrificial material comprises removing between about 12 μm and about 15 μm of the thickness.

15. The method of claim 8, further comprising:
    securing the opposing surface of the device wafer to a support;
    removing the carrier wafer from the device wafer; and
    singulating semiconductor dice from the device wafer.

16. The method of claim 15, wherein securing the opposing surface of the device wafer to a support comprises adhering the opposing surface of the device wafer to a film supported by a film frame.

17. The method of claim 15, further comprising removing any remaining sacrificial material on the surface of the carrier wafer before removing the carrier wafer from the device wafer.

* * * * *